United States Patent
Huesgen et al.

(10) Patent No.: US 9,485,891 B2
(45) Date of Patent: Nov. 1, 2016

(54) ELECTRONIC DEVICE WITH WATERPROOF ENCLOSURE

(71) Applicant: ABB Oy, Helsinki (FI)

(72) Inventors: Till Huesgen, Burgberg (DE); Christoph Schrödl, Porvoo (FI); Daniel Kearney, Zurich (CH); Gernot Riedel, Baden-Rütihof (CH); Jarmo Sukanen, Espoo (FI); Juha Tuomola, Vantaa (FI); Kalle Suomela, Järvenpää (FI); Krzysztof Kasza, Krakow (PL); Lukasz Malinowski, Krakow (PL); Lukasz Matysiak, Krakow (PL); Mikko Nupponen, Espoo (FI); Uwe Drofenik, Zurich (CH)

(73) Assignee: ABB Technology Oy, Helsinki (FI)

( * ) Notice: Subject to any disclaimer, the term of this patent is extended or adjusted under 35 U.S.C. 154(b) by 10 days.

(21) Appl. No.: 14/522,223

(22) Filed: Oct. 23, 2014

(65) Prior Publication Data

US 2015/0116937 A1   Apr. 30, 2015

(30) Foreign Application Priority Data

Oct. 24, 2013 (EP) .................................... 13190094

(51) Int. Cl.
*H05K 7/20* (2006.01)
*H05K 5/00* (2006.01)

(52) U.S. Cl.
CPC ........ *H05K 7/20945* (2013.01); *H05K 5/0091* (2013.01); *H05K 7/202* (2013.01); *H05K 7/209* (2013.01); *H05K 7/20409* (2013.01); *H05K 7/20481* (2013.01); *H05K 7/20909* (2013.01)

(58) Field of Classification Search
CPC .. H05K 7/20745; H05K 7/202; H05K 7/209; H05K 7/20918; H05K 7/20163; H05K 7/20154; H05K 7/20409; H05K 7/20; H05K 7/20754; F28D 15/0266; F28D 15/043; F28D 15/046; F28D 9/00; F28F 3/02
See application file for complete search history.

(56) References Cited

U.S. PATENT DOCUMENTS

| | | | |
|---|---|---|---|
| 6,911,598 B2 * | 6/2005 | Onizuka | H05K 7/026 174/50 |
| 8,446,724 B2 * | 5/2013 | Shimizu | H02G 3/03 361/679.49 |
| 2012/0044640 A1 | 2/2012 | Harada et al. | |

FOREIGN PATENT DOCUMENTS

EP   2 453 567 A1   5/2012

OTHER PUBLICATIONS

European Search Report issued Mar. 13, 2014, by the European Patent Office in corresponding European Patent Application No. 13 19 0094. (2 Pages).

*Primary Examiner* — Robert J Hoffberg
*Assistant Examiner* — Hung Dang
(74) *Attorney, Agent, or Firm* — Taft Stettinius & Hollister LLP

(57) ABSTRACT

An electronic device including a sealed enclosure, the electronic components arranged inside the sealed enclosure and including high-loss high-temperature components, a main heat sink including ribs, wherein the high-loss high-temperature components are attached to the main heat sink and the ribs of the main heat sink are arranged outside the enclosure, a cavity formed inside the enclosure and divided into a plurality of channel-like sections, the channel-like sections configured for providing air flow guidance inside the enclosure and being interconnected at their ends, wherein at least one channel-like section contains the electronic components and at least one other channel-like section contains an air-to-air heat exchanger extending from inside the sealed enclosure to outside of the sealed enclosure, wherein the electronic components inside the at least one channel like section are adapted to be cooled by air flow inside the sealed enclosure.

20 Claims, 6 Drawing Sheets

ELECTRONIC DEVICE WITH WATERPROOF ENCLOSURE

RELATED APPLICATION(S)

This application claims priority under 35 U.S.C. §119 to European Patent Application No. 13190094.6 filed in Europe on Oct. 24, 2013, the entire content of which is hereby incorporated by reference in its entirety.

FIELD

The present disclosure relates to an electronic device, and to the cooling of an electronic device with a waterproof enclosure.

BACKGROUND INFORMATION

With an increasing power density, thermal management of power electronic devices, such as for example, variable speed drives, can become an issue. For many applications, for example in the food and beverage industry, a high ingress protection class (IP class) can be required. In these cases, the electronic components can be enclosed in a sealed housing, which constrains the cooling techniques applied.

Heat losses can be generated in almost any electronic component. In the case of variable speed drives, a major source of losses can be the power module, i.e. the power semiconductor switches. A commercial low-voltage drive with a nominal output power of 4 kW can have heat losses distributed over the individual components, as shown in Table 1. It is to be noted that the values given in Table 1 are examples and do not refer to any specific device. Desirable components for cooling are the power module, due to the high power density, and the electrolytic capacitors of the DC link and auxiliary power supply, due to their temperature sensitivity. As seen from Table 1, the power module can be a high-loss high-temperature component, whereas the other listed components can generate considerably lower losses.

Electronic components can be cooled with air by forced convection at ambient temperature. However, this approach may not be possible for an electronic device enclosed in a sealed housing.

TABLE 1

Distribution of heat losses in a commercial variable speed drive with 4 kW nominal output power.

| Component | Max. temp.(° C.) | Heat loss (W) |
| --- | --- | --- |
| Power module | 125 | 70 W |
| DC capacitors | 85 | 15 W |
| Balancing resistors | 125 | 2 W |
| Control electronics | 125 | 5 W |
| Auxiliary power supply | 85 | 8 W |
| Fan | 70 | 5 W |
| Sum | | 105 W |

An electronic device that can have a high ingress protection class can be cooled by natural convection, as shown in FIG. 1. FIG. 1 shows a structure in which natural convection can be enhanced by shaping a part of the enclosure as an extended surface. In the case of variable speed drives, the power module, having the highest heat losses, can be directly attached to a heat sink, which can minimize its junction to ambient thermal resistance. The low-loss components can be arranged on circuit boards 11 located inside the sealed space. For cooling, an internal fan 12 circulates the air inside.

One thermal bottleneck can be the heat rejection from the internal air through the enclosure to the ambient air. This bottleneck can cause an increased air temperature inside, which yields higher component temperatures and therefore can decrease their lifetime. Due to the power module's heat losses, the temperature of the baseplate of the heat sink is usually relatively high, which can cause an additional heating of the internal air.

SUMMARY

An electronic device is disclosed comprising: a sealed enclosure; electronic components arranged inside the sealed enclosure and including high-loss high-temperature components; a main heat sink including ribs, wherein the high-loss high-temperature components are attached to the main heat sink and the ribs of the main heat sink are arranged outside the enclosure; a cavity formed inside the enclosure and divided into a plurality of channel-like sections, the channel-like sections configured for providing air flow guidance inside the enclosure and being interconnected at their ends, wherein at least one channel-like section contains the electronic components and at least one other channel-like section contains an air-to-air heat exchanger extending from inside the sealed enclosure to outside of the sealed enclosure, wherein the electronic components inside the at least one channel like section are adapted to be cooled by air flow inside the sealed enclosure.

BRIEF DESCRIPTION OF THE DRAWINGS

In the following, the disclosure will be described in greater detail by exemplary embodiments with reference to the accompanying drawings, in which.

DETAILED DESCRIPTION

Exemplary embodiments of the disclosure are based on the idea of arranging an interior of an enclosure of an electrical device such that channel-like cavities are formed inside the enclosure. The air inside the enclosure flows due to temperature differences. At least one of the channel-like cavities includes an air-to-air heat exchanger for cooling the air inside the enclosure. Further, heat-generating components of the electrical device can be arranged to at least one other of the cavities.

In exemplary embodiments of the disclosure an electronic device with a high ingress protection class can be cooled more efficiently than known devices.

According to an exemplary embodiment of the disclosure, the electronic device can also include a cooling fan inside the enclosure for further improving the cooling of the device. However, the channel-like cavities inside the enclosure provide air circulation inside the enclosure even without the fan.

According to another exemplary embodiment of the disclosure, a baseplate of a main heat sink used for cooling the power module or power semiconductors can be thermally shielded from an electronics chamber. Such a thermal shielding can limit the heat input from the power semiconductors to the internal air.

Figure 1:
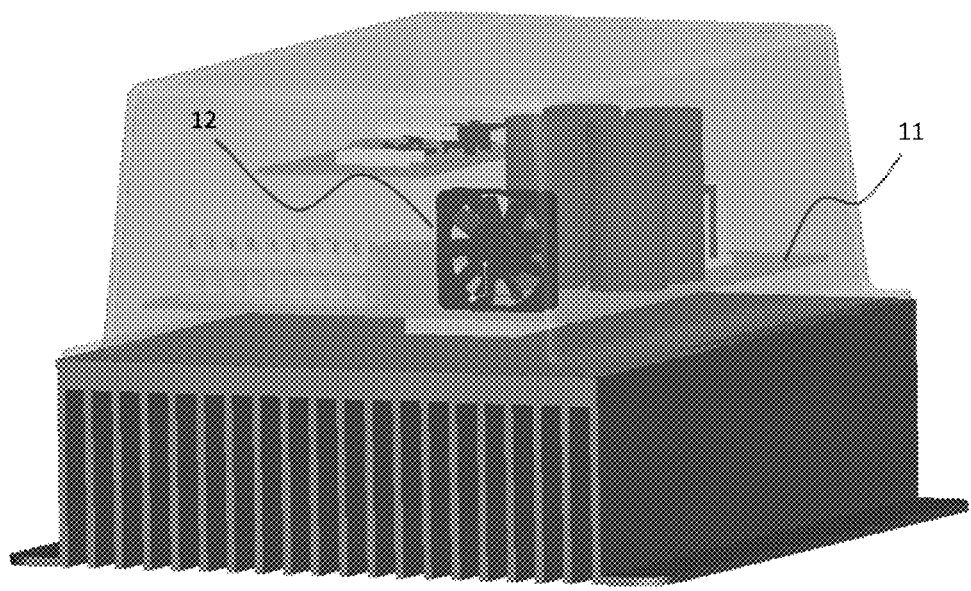
FIG. 1 shows a prior art structure with a high ingress protection class.
Figure 2:
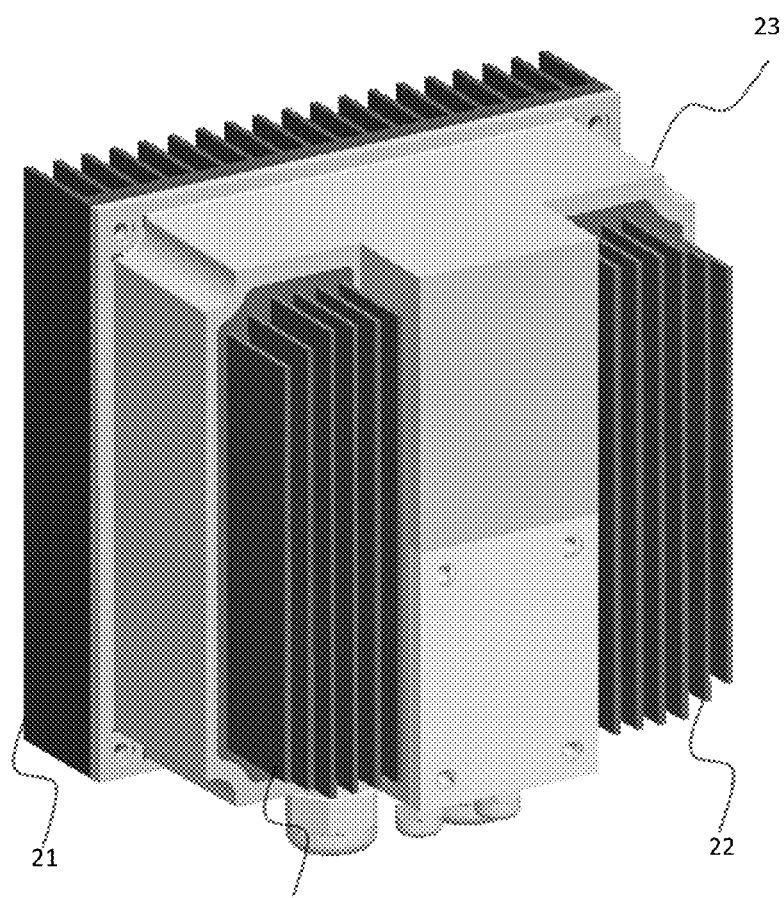
FIG. 2 shows a perspective view of an exemplary embodiment of the present disclosure.

FIG. 2 shows an outer structure of an exemplary embodiment of the present disclosure. The visible parts include a main heat sink 21, two auxiliary heat sinks 22, and an enclosure enclosing electronic components. A base plate of the main heat sink 21 forms a part of the enclosure, i.e. a cover 23 is attached to the base plate of the heat sink in a sealed manner.

Figure 3:
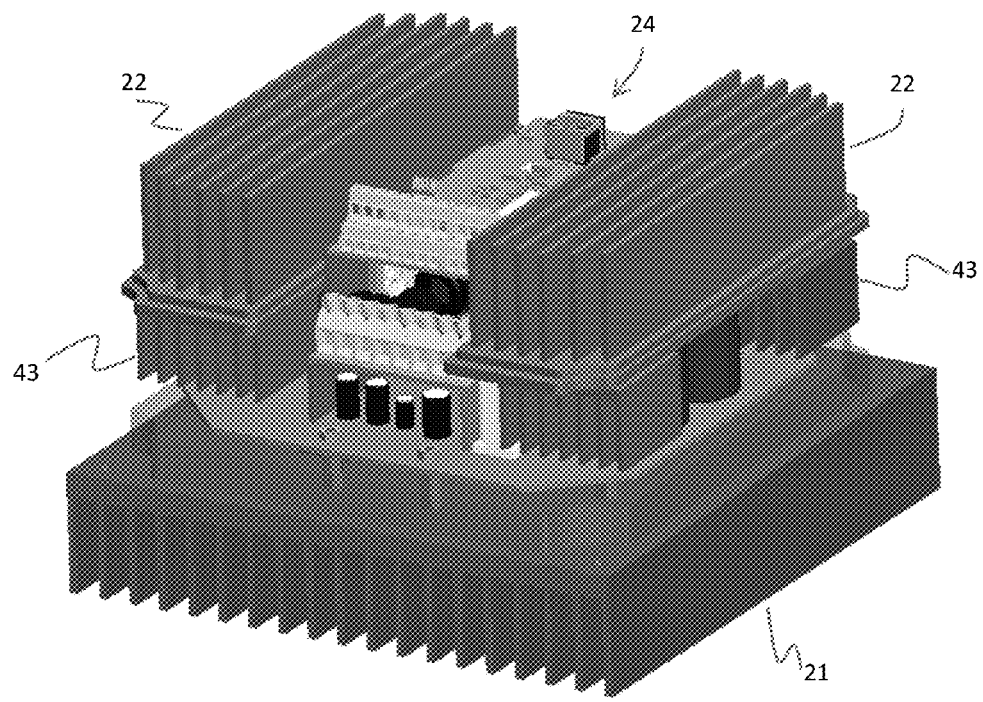
FIG. 3 shows an exemplary embodiment of the disclosure without the casing.

FIG. 3 shows the structure of the embodiment of FIG. 2 without the enclosure, thus revealing the inner structure of an electronic device. The electronic device of the disclosure includes electronic components 24 that are arranged inside the sealed enclosure. Some of the electronic components can be high-loss high-temperature components, and these include power semiconductor switches, for example. As mentioned, the electronic device includes the main heat sink 21 to which the high-loss high-temperature components are attached. As mentioned above, the ribs of the main heat sink 21 are outside the enclosure, while the baseplate of the heat sink forms a part of the sealed enclosure.

According to an exemplary embodiment of the disclosure, the cavity formed inside the enclosure can be divided into two or more channel-like sections. These sections provide paths for the circulating air inside the enclosure, the sections being interconnected at their ends. The embodiment shown in FIG. 3 is formed with three sections such that two sections are on the sides and one section is between these two sections.

According to an exemplary embodiment, at least one of the channel-like sections can contain electronic components and at least one other channel-like section contains an air-to-air heat exchanger. In the embodiment of FIG. 3, the air-to-air heat exchangers are situated in the sections on the sides of the electronic device, while the channel in the center contains electronic components, such as printed circuit board assemblies (PCBAs), auxiliary power supply components, control circuitry EMC filter, etc. The center section is a "hot" section in which the air inside the enclosure warms up during the use of the device and the side sections are "cold" sections in which heat is removed from the air and thus the circulating air is cooled.

In FIG. 3 the air-to-air heat exchangers are formed of the heat sinks such that one heat sink 43 is inside the device and its baseplate is attached to an auxiliary heat sink 22. The cooling ribs or fins of the auxiliary heat sink are outside the structure, and thereby the combination of the heat sinks act as an air-to-air heat exchanger removing heat from the enclosure.

Figure 4:
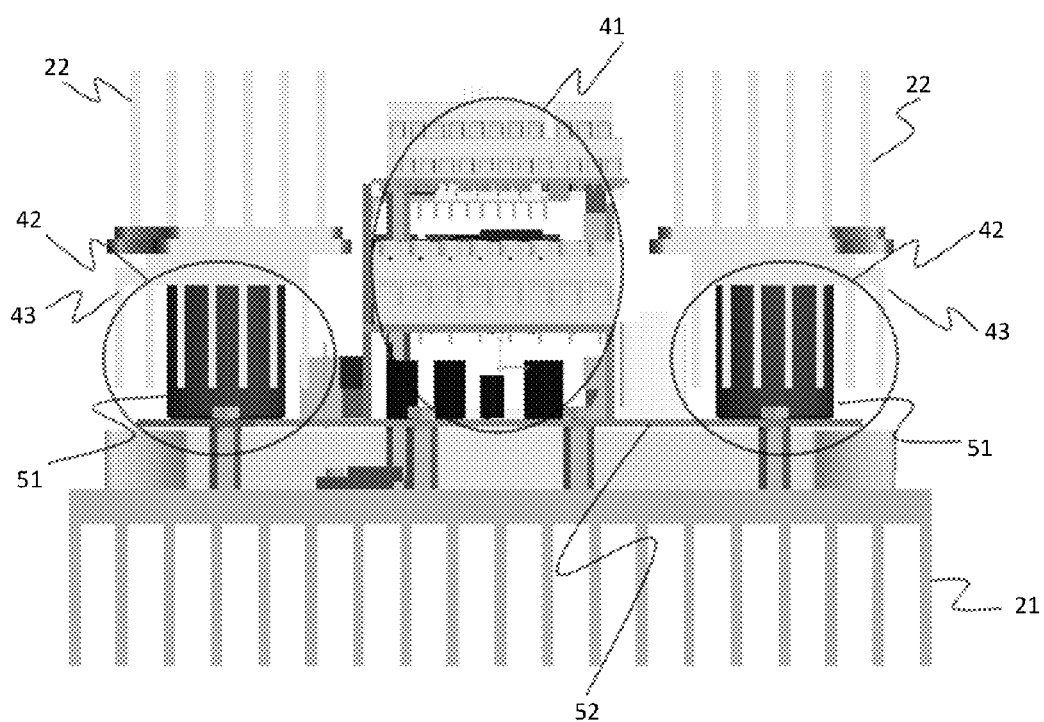
FIG. 4 is a bottom view of the inside of an exemplary embodiment of the disclosure.
Figure 5:
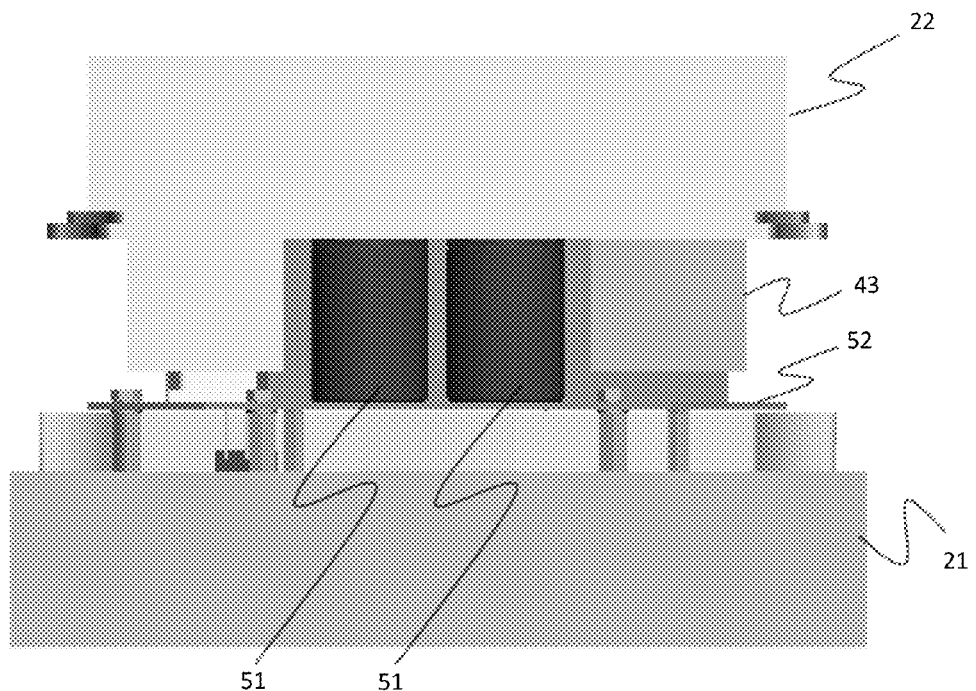
FIG. 5 is a side view of the inside of an exemplary embodiment of the disclosure.

According to an exemplary embodiment of the disclosure, temperature sensitive components can be attached to the auxiliary heat sink. As shown in FIGS. 3, 4 and 5, DC link capacitors can be situated on the sides of the device and in the "cold" sections such that the ends of the capacitors are attached to auxiliary heat sinks. The internal heat sinks, which are used for air-to-air heat exchanger, are divided in two and the capacitors are in the middle of the internal sinks. FIG. 4 shows the structure of the electronic device of an exemplary embodiment of the disclosure as seen from below and partly opened. Further, for better understanding of the disclosure, the different sections or compartments are shown as circles in FIG. 4, the "hot" section 41 with the electronic components being in the center and the "cold" sections 42 being on the sides of the device.

As seen in FIG. 4, the center compartment 41 can be basically formed of printed circuit board assemblies such that the circuit boards are aligned so that a channel is formed. The circuit boards are thus arranged to guide the air flow. It should be noted that the compartments or channels are not necessarily airtight. That is to say, the walls of the channels can have holes or openings. The channels are to lead the air flow and for that purpose, tightness of the walls of the compartments is not required. In addition to printed circuit boards, the walls of the compartments can also include other elements solely for the purpose of generating the flow pattern.

The channels formed inside the enclosure are aligned with gravity to allow for air circulation driven by natural convection. In FIG. 4, which is a bottom view of the device, the heated air rises up in the center compartment 41 and comes down in the side compartments 42.

According to an exemplary embodiment of the disclosure, one or more fans can be placed inside the enclosure to further enhance cooling. The fan can be placed in the center compartment, for example, such that it pushes the heated air to the side compartments. The use of the fan may help in obtaining a larger power range from a device of a same frame size but without a fan.

The electronic device of an exemplary embodiment of the present disclosure can include active components, such as semiconductors switches and diodes, and passive components, such as capacitors, inductors and resistors. Further, the device can include electrical interconnections such PCB and/or busbars and control electronics for controlling the operation of the device.

The electronics of the electronic device can be located in an enclosure with a high ingress protection class. The protection class may be IP66 or "waterproof." The enclosure of the device can be made, for example, of aluminum (die cast, extruded or machined), thermally conductive (filled) polymers and standard polymers (injection molded or extruded), or a mixture thereof.

Further, the semiconductor modules, i.e., semiconductor switches and diodes, can be directly mounted on the main heat sink, which is part of the enclosure.

According to an exemplary embodiment of the disclosure, a thermal insulation sheet can be placed on the main heat sink to insulate it from the internal air of the electronics chamber. The sheet can be made of any thermal insulator, such as organic foams, aerogels, or vacuum insulators. The thermal insulator can be, however, formed in such a way that the power module or discrete power switch components are cooled with the main heat sink.

The enclosure chamber is divided in channel-like sections that are interconnected at both their ends to allow circulation of the internal air. The division into this channel-like structure can be constituted by the PCBA or by additional flow-guiding structures.

At least one of the channels or compartments can contain a major part of the PCBA. The other channels or compartments can contain air-to-air heat exchangers that transfer heat through the boundary of the enclosure. In an exemplary embodiment of the disclosure, the heat exchanger can be composed of fin-type radiator structures. One auxiliary heat sink per cooling channel can be embedded into the cover, two internal heat sinks can be attached base to base to the auxiliary heat sink. However, an integral construction or other types of air-to-air heat exchangers are also possible. The auxiliary heat sinks can be fabricated from one piece. The fabrication using a one piece structure enables simpler mechanical construction as the auxiliary heat sinks will be kept in place with respect to each other during the manufacturing process. As the auxiliary heat sinks are made from one piece, the structure between the heat sinks is overmolded during the manufacture of the device. If the auxiliary heat sinks were produced separately, the structure could require additional support structures for keeping the auxiliary heat sinks in place. The above mentioned cooling channel refers to a compartment inside the enclosure that does not include the major part of the PCBA and includes an air-to-air heat exchanger.

Further, temperature sensitive components, such as electrolytic DC link capacitors 51, can also be thermally attached to this auxiliary heat sink 22, to provide more efficient cooling. A commercially available, thermally conductive gap filler can be used for efficient thermal coupling. In FIGS. 4 and 5 the capacitors 51 are shown attached to the auxiliary heat sinks. The capacitors are electrically connected to a circuit board 52 close to the main heat sink and thermally connected to the auxiliary heat sink 22, which also function as air-to-air heat exchangers.

All heat sinks as well as the channel axis can be oriented with gravity. This means that the ribs of the heat sinks and the channel like sections inside the enclosure of the device extend in the same direction. Further, when the device is in its intended operating position, the channels are upright. Hence, the electronic components in the center section cause a local temperature rise, whereas the air-to-air heat exchanger in the cooling sections causes a temperature drop. This temperature gradient will drive a natural convection air flow.

As mentioned above, a fan may be included for example on top of the center section. This fan enhances cooling, which allows to extend the power rating for a given frame size or to operate the device at higher ambient temperatures. Further enhancements are possible by placing flow-guiding structures to direct the air stream towards the components.

In the enclosure configuration of the embodiment of FIG. 2, there is space on the cover between the two auxiliary heat sinks. This space can be used for a control panel and a service cover.

Figure 6:
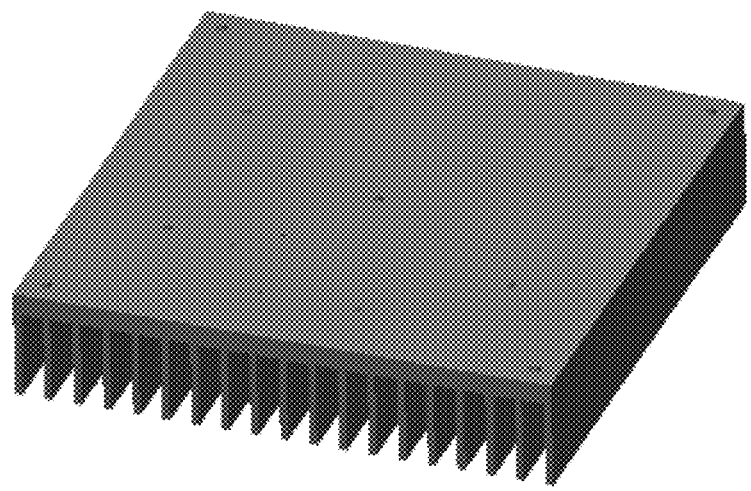
FIGS. 6(a)-6(f) show assembly phases of an exemplary embodiment of the present disclosure.
Figure 6:
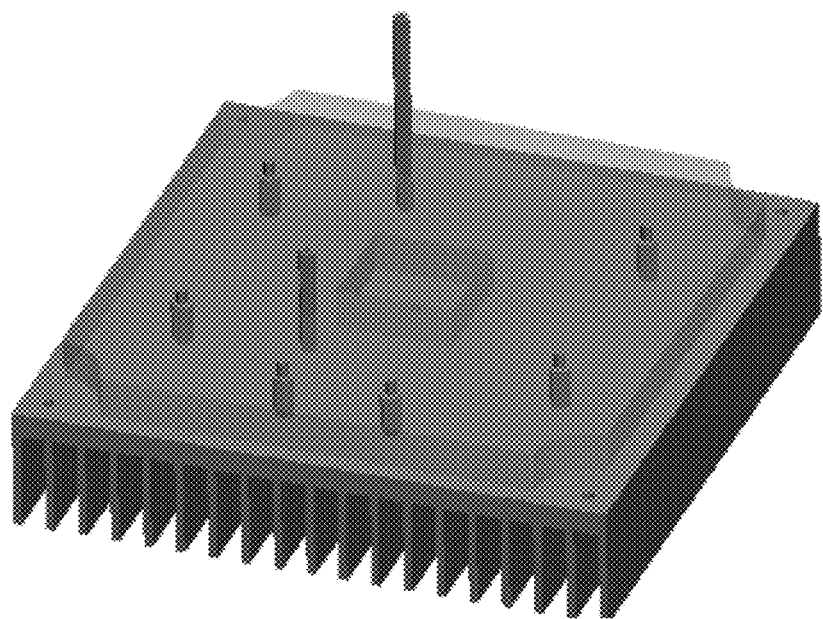
Figure 6:
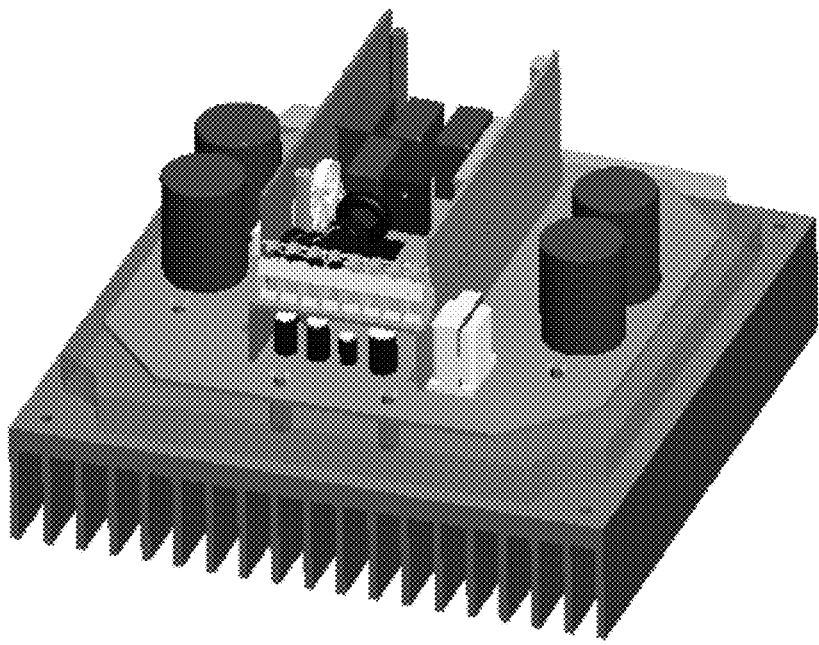
Figure 6:
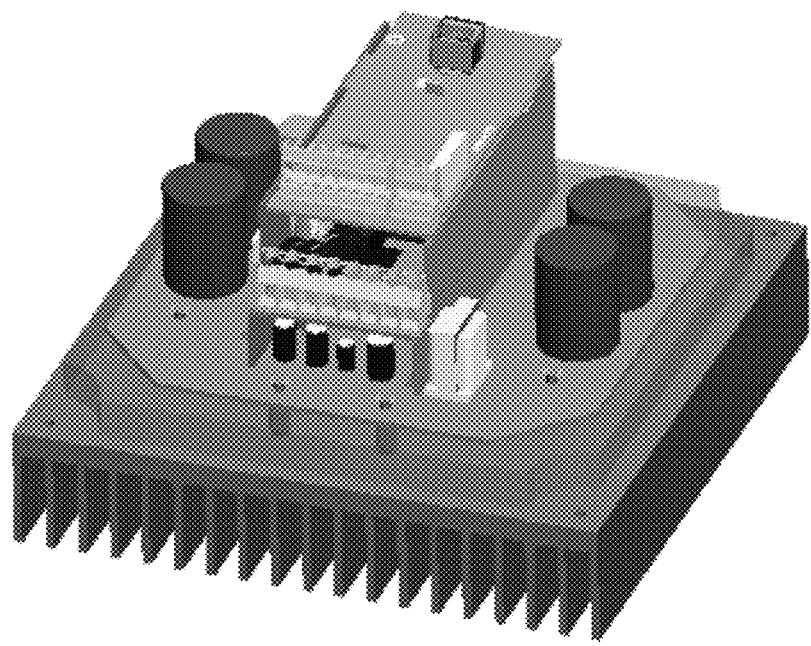
Figure 6:
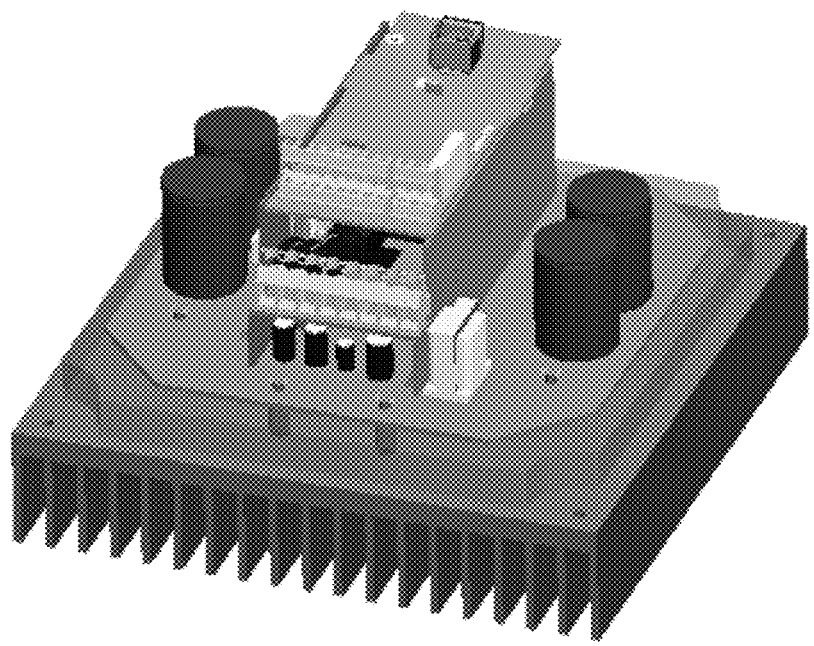
Figure 6:
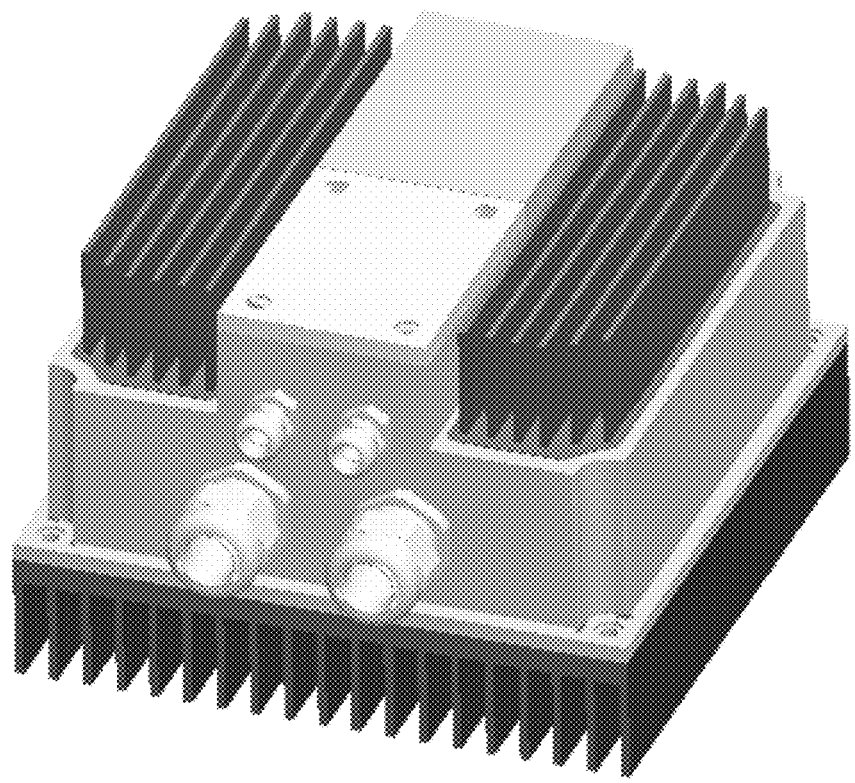

An entire device of an exemplary embodiment of the disclosure shown in the drawings can be assembled in a simple manner, as illustrated in FIGS. 6 a)-6 f). First, in FIG. 6 a) the bottom part of the enclosure with main heat sink is provided. The bottom part can be fabricated, for example, by extrusion or die casting of aluminum. Next, the insulation sheet is set to the bottom part and a stand-off is mounted (FIG. 6 b)). In the next phase (FIG. 6 c)) the pre-fabricated printed circuit boards are placed and attached to the stand-off by, for example, screws. Also the power module is attached to the main heat sink.

Next (FIG. 6 d)), additional parts, such as a control board, are attached to the structure. It is seen in FIG. 6 d) how the control board is set on the top of other PCBs so that a channel is formed using the PCB structures. In the next assembly phase (FIG. 6 e)), thermal gap filler is applied on top of temperature sensitive components, such as capacitors, for thermal interface to the auxiliary heat sink. In the last assembly phase (FIG. 6 f)), a cover can be provided with an integrated air-to-air heat exchanger. The cover can be fabricated, for example by injection molding or by die casting. The cover is placed on the top and fixed to the main heat sink by, for example, screws.

All parts and screws in the assembling procedure can be applied from the same direction and do not require turning of the device during assembly. It should be noted that the position of the device shown in the assembly procedure is not the same as its operating position. As mentioned above, the electronic device of the disclosure is intended for operation in a position in which the internal compartments or channels are aligned with gravity i.e. the channels are upright.

As brought forward above, the device of the disclosure can be cooled in a passive manner, which means that all component temperatures can be maintained below their maximum rating without a fan. The passive cooling increases reliability as the fan is a component with rather a short lifetime. Further, the costs of the device can be lower due to the absence of a fan. The design of the device allows a fan to be used. If a fan is used, the power rating of a certain frame size can be increased. If an optional fan is included, the possible fan failure would not lead to a catastrophic overheating, as natural convection would still provide some cooling.

Although the above description mainly focuses to an embodiment with three channels inside the enclosure, the electronic device of an exemplary embodiment of the present disclosure can also be provided with a different number of channel-like cavities, such as two, four or five. Further, in a described embodiment, the hot channel is situated in the center and the two cold channels are on the sides of the center channel. However, according to an exemplary embodiment of the disclosure, the side channels can include the heat generating electronic equipment and the center channel can include the air-to-air heat exchanger. In this embodiment, the air circulation is reversed, i.e. the hot air rises up in the side channels and circulates through the center channel down and back to the side channels.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An electronic device comprising:
    a sealed enclosure;
    electronic components arranged inside the sealed enclosure and including one or more high-loss high-temperature components;
    a main heat sink including ribs, wherein the high-loss high-temperature components are attached to the main heat sink and the ribs of the main heat sink are arranged outside the enclosure;
    a cavity formed inside the enclosure and divided into a plurality of channel-like sections, the channel-like sections configured for providing air flow guidance inside the enclosure and being interconnected at their ends, wherein
    at least one channel-like section contains the electronic components and at least one other channel-like section contains an air-to-air heat exchanger extending from inside the sealed enclosure to outside of the sealed enclosure, wherein the electronic components inside the at least one channel like section are adapted to be cooled by air flow inside the sealed enclosure, wherein the air-to-air heat exchanger comprises:
an auxiliary heat sink; and
an internal heat sink, a base plate of the auxiliary heat sink and a base plate of the internal heat sink being connected to each other.

2. An electronic device according to claim 1, wherein the main heat sink, air-to-air heat exchanger, and channel-like sections are aligned in an upright orientation allowing for an internal air circulation based on natural convection.

3. An electronic device according to claim 1, wherein the electronic device comprises:
at least one internal fan for providing cooling air flow.

4. An electronic device according to claim 1, comprising:
a thermally insulating sheet for thermally insulating the main heat sink from the remainder of the enclosed chamber.

5. An electronic device according to claim 1, wherein temperature sensitive components are arranged in contact with the base plate of the auxiliary heat sink.

6. An electronic device according to claim 1, comprising:
three channel-like sections, a first section arranged in a center and two other sections arranged on sides of the first section, the first section arranged in the center containing the electronic components and the two other sections on the sides of the first section each containing an air-to-air heat exchanger.

7. An electronic device according to claim 1, comprising:
three channel-like sections, a first section arranged in a center and two sections arranged on sides of the first section, the two sections arranged on the sides of the first section containing the electronic components and the first section arranged in the center containing an air-to-air heat exchanger.

8. An electronic device according to claim 1, wherein the enclosure is made of metals or polymers or a mixture thereof using a fabrication process such as extrusion, die casting, or injection molding.

9. An electronic device according to claim 1, wherein the electronic device is a power electronic converter.

10. An electronic device according to claim 9, wherein the power electronic converter is a variable frequency converter, photovoltaic inverter, or power supply.

11. An electronic device according to claim 5, wherein the temperature sensitive components include capacitors.

12. An electronic device according to claim 5, wherein the enclosure is waterproof.

13. An electronic device according to claim 1, wherein the electronic device is a power electronic converter, and comprising:
three channel-like sections, a first section arranged in a center and two other sections arranged on sides of the first section, the first section arranged in the center containing the electronic components and the two other sections on the sides of the first section each containing an air-to-air heat exchanger.

14. An electronic device according to claim 13, wherein temperature sensitive components are arranged in contact with the base plate of the auxiliary heat sink, and the enclosure is waterproof.

15. An electronic device according to claim 14, wherein the main heat sink, air-to-air heat exchanger, and channel-like sections are aligned in an upright orientation allowing for an internal air circulation based on natural convection.

16. An electronic device according to claim 15, wherein the electronic device comprises:
at least one internal fan for providing cooling air flow, and comprising:
a thermally insulating sheet for thermally insulating the main heat sink from the remainder of the enclosed chamber.

17. An electronic device according to claim 16, wherein the enclosure is made of metals or polymers or a mixture thereof using a fabrication process such as extrusion, die casting, or injection molding, the power electronic converter is a variable frequency converter, photovoltaic inverter, or power supply, and the temperature sensitive components include capacitors.

18. An electronic device comprising:
a sealed enclosure;
electronic components arranged inside the sealed enclosure and including one or more high-loss high-temperature components;
a main heat sink including ribs, wherein the high-loss high-temperature components are attached to the main heat sink and the ribs of the main heat sink are arranged outside the enclosure;
a cavity formed inside the enclosure and divided into a plurality of channel-like sections, the channel-like sections configured for providing air flow guidance inside the enclosure and being interconnected at their ends, wherein
at least one channel-like section contains the electronic components and at least one other channel-like section contains an air-to-air heat exchanger extending from inside the sealed enclosure to outside of the sealed enclosure, wherein the electronic components inside the at least one channel like section are adapted to be cooled by air flow inside the sealed enclosure; and
a thermally insulating sheet for thermally insulating the main heat sink from the remainder of the enclosed chamber.

19. An electronic device according to claim 18, wherein the electronic device is a power electronic converter.

20. An electronic device according to claim 19, comprising:
three channel-like sections, a first section arranged in a center and two other sections arranged on sides of the first section, the first section arranged in the center containing the electronic components and the two other sections on the sides of the first section each containing an air-to-air heat exchanger.

* * * * *